United States Patent
Son et al.

(10) Patent No.: US 9,123,905 B2
(45) Date of Patent: Sep. 1, 2015

(54) SOLAR CELLS AND METHODS OF MANUFACTURING THE SAME

(75) Inventors: Hyung-bin Son, Seoul (KR); O-hyun Kim, Pohang-si (KR); Boong-ik Park, Daegu (KR); Jun-hwan Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 306 days.

(21) Appl. No.: 13/152,480

(22) Filed: Jun. 3, 2011

(65) Prior Publication Data

US 2012/0125413 A1    May 24, 2012

(30) Foreign Application Priority Data

Nov. 23, 2010   (KR) .................. 10-2010-0117105

(51) Int. Cl.
| H01L 51/44 | (2006.01) |
| H01L 21/02 | (2006.01) |
| B82Y 30/00 | (2011.01) |
| H01L 51/42 | (2006.01) |
| H01L 51/00 | (2006.01) |

(52) U.S. Cl.
CPC .............. *H01L 51/447* (2013.01); *B82Y 30/00* (2013.01); *H01L 21/02603* (2013.01); *H01L 51/4266* (2013.01); *H01L 51/0036* (2013.01); *H01L 51/0037* (2013.01); *H01L 51/4233* (2013.01); *H01L 51/4253* (2013.01); *Y02E 10/549* (2013.01)

(58) Field of Classification Search
CPC ............ H01L 31/0224; H01L 51/4226; H01L 51/44223; H01L 51/426; H01L 51/5056; H01L 51/5203; H01L 21/28; H01L 21/306; H01L 31/035227; H01L 21/02603; H01L 29/0676
USPC ........................................................ 136/255
See application file for complete search history.

(56) References Cited

U.S. PATENT DOCUMENTS

| 6,399,873 | B1 * | 6/2002 | Sano et al. ..................... 136/249 |
| 7,508,043 | B2 | 3/2009 | Mukai |
| 2005/0098205 | A1 * | 5/2005 | Roscheisen et al. .......... 136/263 |
| 2005/0151122 | A1 * | 7/2005 | Jiang et al. .................... 252/500 |
| 2009/0000660 | A1 * | 1/2009 | Pellin et al. ................... 136/256 |
| 2009/0165844 | A1 * | 7/2009 | Dutta ............................. 136/255 |
| 2009/0194160 | A1 * | 8/2009 | Chin et al. ..................... 136/256 |
| 2010/0012184 | A1 * | 1/2010 | Naya et al. .................... 136/256 |

FOREIGN PATENT DOCUMENTS

| JP | 2005-324325 A | 11/2005 |
| JP | 2009-158915 A | 7/2009 |
| KR | 10-0747074 B1 | 8/2007 |
| KR | 10-2009-0022956 A | 3/2009 |
| KR | 10-2009-0024846 A | 3/2009 |
| KR | 10-2010-0062339 A | 6/2010 |

* cited by examiner

*Primary Examiner* — Jennifer Michener
*Assistant Examiner* — Sadie White
(74) *Attorney, Agent, or Firm* — Sughrue Mion, PLLC

(57) ABSTRACT

Solar cells and methods of manufacturing the solar cells are provided. The solar cell may be formed on a substrate having a plurality of concave portions. A plurality of nanostructures may be formed on a surface of the substrate, in which the plurality of concave portions are formed. A photoactive layer may be formed to cover the plurality of nanostructures. The nanostructures may include an inorganic material, and the photoactive layer may include an organic material.

27 Claims, 5 Drawing Sheets

SOLAR CELLS AND METHODS OF MANUFACTURING THE SAME

CROSS-REFERENCE TO RELATED APPLICATION

This application claims priority from Korean Patent Application No. 10-2010-0117105, filed on Nov. 23, 2010, the disclosure of which is incorporated herein in its entirety by reference.

BACKGROUND

1. Field

The following description relates to solar cells and manufacturing the same.

2. Description of the Related Art

Solar cells generating electric energy by using solar energy are environmentally friendly and known as a limitless energy source with a long lifetime.

Currently commercialized solar cells are mostly inorganic solar cells based on silicon. In contrast to these inorganic solar cells, solar cells having an active layer based on an organic material (hereinafter referred to as "organic solar cells") have been suggested. Organic solar cells may have a small thickness and be manufactured at low costs, and may be applied to various flexible devices.

However, photovoltaic conversion efficiency of organic solar cells is still low at about 5 to 6%. Thus, in order to improve the efficiency, various research and development is being conducted. For example, various attempts have been made to improve the characteristics of the material of an organic active layer.

SUMMARY

One or more embodiments provide solar cells with increased photovoltaic conversion efficiency.

One or more embodiments provide methods of manufacturing the solar cells.

Various aspects will be set forth in part in the description which follows and, in part, will be apparent from the description, or may be learned by practice of the presented embodiments.

According to an aspect of an embodiment, a solar cell includes: a substrate, on a surface of which a plurality of concave portions are formed, the substrate including a first electrode; a plurality of vertical nanostructures which are disposed on the surface of the substrate, on which the plurality of concave portions are formed, and are connected to the first electrode; a photoactive layer disposed to cover the plurality of nanostructures; and a second electrode disposed on the photoactive layer.

A plurality of the nanostructures may be disposed in each of the plurality of concave portions.

The plurality of nanostructures may be in a form of nanorods.

The plurality of nanostructures may include an inorganic material.

The plurality of nanostructures may include at least one of ZnO, Si, CNT, and $TiO_2$.

The photoactive layer may include an organic material.

The photoactive layer may include a bulk heterojunction (BHJ) structure.

The solar cell of claim may further include a hole transport layer disposed between the photoactive layer and the second electrode.

The concave portions may have a hemisphere shape or a semi-hemisphere shape.

The substrate may include aluminum (Al).

The substrate itself may be used as the first electrode.

The substrate may include: a base layer, in a surface of which the plurality of concave portions are formed; and the first electrode being formed conformally on the surface of the baser layer.

According to an aspect of another embodiment, a method of manufacturing a solar cell, the method including: providing a substrate, on a surface of which a plurality of concave portions are formed, wherein the substrate includes a first electrode; forming a plurality of vertical nanostructures on the surface of the substrate, on which the plurality of concave portions are formed, wherein the plurality of vertical nanostructures are connected to the first electrode; forming a photoactive layer covering the plurality of nanostructures; and forming a second electrode on the photoactive layer.

The providing the substrate may include: forming an oxide layer by anodizing the surface of the substrate; and forming the plurality of concave portions by removing the oxide layer from the substrate.

The method may further include forming the first electrode on the first surface of the substrate, on which the plurality of concave portions are formed.

The substrate may be an aluminum substrate.

The plurality of nanostructures may include an inorganic material.

The plurality of nanostructures may include at least one of ZnO, Si, CNT, and $TiO_2$.

The plurality of nanostructures may be formed using a hydrothermal method or a chemical vapor deposition (CVD) method.

A plurality of the nanostructures may be formed in each of the concave portions.

The photoactive layer may include an organic material.

The photoactive layer may include a bulk heterojunction (BHJ) structure.

The method may further include forming a hole transport layer between the photoactive layer and the second electrode.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

Figure 1:
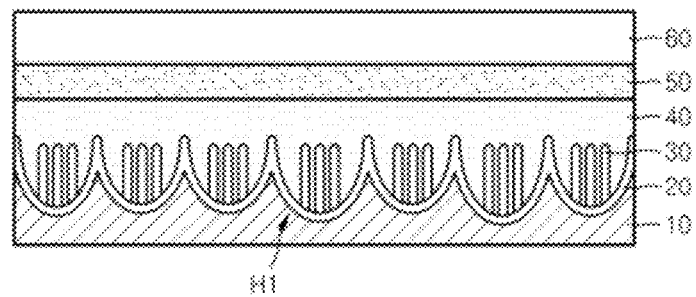
FIG. 1 is a cross-sectional view illustrating a solar cell according to an embodiment.

Reference will now be made in detail to embodiments, examples of which are illustrated in the accompanying drawings. In this regard, the embodiments may have different forms and should not be construed as being limited to the descriptions set forth herein. Accordingly, the embodiments are merely described below, by referring to the figures, to explain aspects of the inventive concept.

Various embodiments will now be described more fully with reference to the accompanying drawings in which the embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or other orientations) and the spatially relative descriptors used herein interpreted accordingly.

The terminology used herein is for the purpose of describing particular embodiments only, and is not intended to limit the exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof Exemplary embodiments are described herein with reference to cross-sectional illustrations that are schematic illustrations of idealized embodiments (and intermediate structures) of the embodiments. As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein have the same meaning as commonly understood by one of ordinary skill in the art to which the embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the drawings, the thicknesses of layers and regions are exaggerated for clarity. Like reference numerals in the drawings denote like elements.

FIG. 1 is a cross-sectional view illustrating a solar cell according to an embodiment.

Referring to FIG. 1, a base layer 10, in an upper surface of which a plurality of concave portions H1 are formed, may be provided, and a first electrode 20 may be disposed on the upper surface of the base layer 10. The base layer 10 may be a conductive layer. The base layer 10 may be a conductive layer including aluminum (Al). For example, the base layer 10 may be an Al layer. The plurality of concave portions H1 formed in the upper surface of the baser layer 10 may be hemisphere type or semi-hemisphere type concave portions. However, the shape of the plurality of concave portions H1 is not limited thereto, and may vary. The size and shape of the plurality of concave portions H1 may be somewhat irregular but may also be uniform according to circumstances.

The first electrode 20 may be conformally formed according to the shape of a surface (upper surface) of the base layer 10. Accordingly, even when the first electrode 20 is formed, the shape of the plurality of concave portions H1 may be maintained. The first electrode 20 may include at least one of Al, Ag, Au, and graphene, for example. The material of the first electrode 20 is not limited to those described above, and may vary. When the base layer 10 is a conductive layer and has a low specific resistance, the base layer 10 may be used as an electrode (bottom electrode), and thus the first electrode 20 may not be formed. However, when the first electrode 20 is additionally formed, conductive characteristics of the solar cell may be improved. For example, when the base layer 10 is an Al layer, if the first electrode 20 is formed of Ag, Au, or graphene which has a higher electric conductivity than Al, conductive characteristics of the solar cell may be improved.

The base layer 10 and the first electrode 20 together may be regarded as one bottom layer (or substrate). In this case, the plurality of concave portions H1 may be regarded as being formed in an upper surface of the bottom layer (substrate), and the bottom layer (substrate) may be regarded as including the first electrode 20.

A plurality of vertical nanostructures (hereinafter, "nanostructures") 30 may be formed on the first electrode 20. The plurality of nanostructures 30 may be, for example, in the form of nanorods or nanowires. The plurality of nanostructures 30 may be formed in each of the plurality of concave portions H1. The nanostructures 30 may have a length (height) that approximately corresponds to a depth of the concave portions H1 but the length (height) of the nanostructures 30 may vary. According to circumstances, the nanostructures 30 may be formed to protrude out of the concave portions H1. The nanostructures 30 may include an inorganic material. For example, the nanostructures 30 may be formed of ZnO. However, the material of the nanostructures 30 is not limited to ZnO and may vary. For example, the nanostructures 30 may be formed of Si, carbon nanotube (CNT), $TiO_2$ or other inorganic materials. As described above, when the nanostructures 30 are formed of an inorganic material, the nanostructures 30 may have excellent electron-transporting characteristics. This is because electron mobility of an inorganic material may be higher than that of an organic material. Due to these characteristics of the nanostructures 30, the nanostructures 30 may be used as an electron-transporting element. This will be described in detail later.

A photoactive layer 40 covering the plurality of nanostructures 30 may be disposed on the first electrode 20. The photoactive layer 40 may fill spaces between the plurality of nanostructures 30 and may contact the entire surfaces of the plurality of nanostructures 30 and the first electrode 20. Thus, the plurality of nanostructures 30 may be regarded as extending into the photoactive layer 40. The photoactive layer 40 may include an organic material. In other words, the photoactive layer 40 may be a material layer based on an organic material. For example, the photoactive layer 40 may be an organic material layer (e.g., polymer layer) having a bulk heterojunction (BHJ) structure. In the BHJ structure, a donor material and an acceptor material are mixed in several tens of nanometer scale or less. A donor/acceptor interface area in the above-described BHJ structure is far greater than that in a PN bi-layer structure, and accordingly, charge-separation efficiency may be increased, and the photovoltaic conversion efficiency may be improved accordingly. In detail, the photoactive layer 40 may include "P3HT:PCBM" in which poly-3(hexylthiophene) (P3HT) and phenyl-C61-butyric acid methyl ester (PCBM) are mixed. However, the material of the photoactive layer 40 is not limited thereto, and may include various other materials. Also, the photoactive layer 40 may have other structures instead of the BHJ structure, for example, a PN bi-layer structure or a single layer structure.

A hole transport layer (HTL) 50 may be disposed on the photoactive layer 40. The hole transport layer 50 transports holes generated in the photoactive layer 40 to a second electrode 60, and may be formed of a polymer such as TPD:DPS-TPD, TFB, PEDOT:PSS, or the like. TPD denotes N,N'-di(3-methylphenyl)-N,N'-di(phenyl)benzidine, DPS denotes N,N'-bis(4-(2,2-diphenylethenyl)-phenyl), TFB denotes (4-butylphenyl)diphenylamine, and PEDOT:PSS denotes poly(3,4-ethylenedioxythiophene)-poly(styrenesulfonate). However, the material of the hole transport layer 50 is not limited thereto, and may include other various organic materials. Also, in some cases, the hole transport layer 50 may not be included.

The second electrode 60 may be disposed on the hole transport layer 50. For example, the second electrode 60 may be formed of a transparent conductive oxide such as indium tin oxide (ITO), indium zinc oxide (IZO), or gallium indium zinc oxide (GIZO) or any of other conductive materials, for example, graphene. Graphene is a hexagonal single layer structure formed of carbon atoms and has a high charge mobility, a low specific resistance, and excellent light transmissivity. The above-described materials of the second electrode 60 are exemplary. That is, the second electrode 60 may be formed of other various materials that are not described here.

As described above, the solar cell according to the current embodiment includes the plurality of nanostructures 30 formed in each of the plurality of concave portions H1 and the photoactive layer 40 formed on the nanostructures 30. Thus, the photovoltaic conversion efficiency of the solar cell according to the current embodiment may be high. This will be described in detail below with reference to FIGS. 2 and 3.

Figure 2:
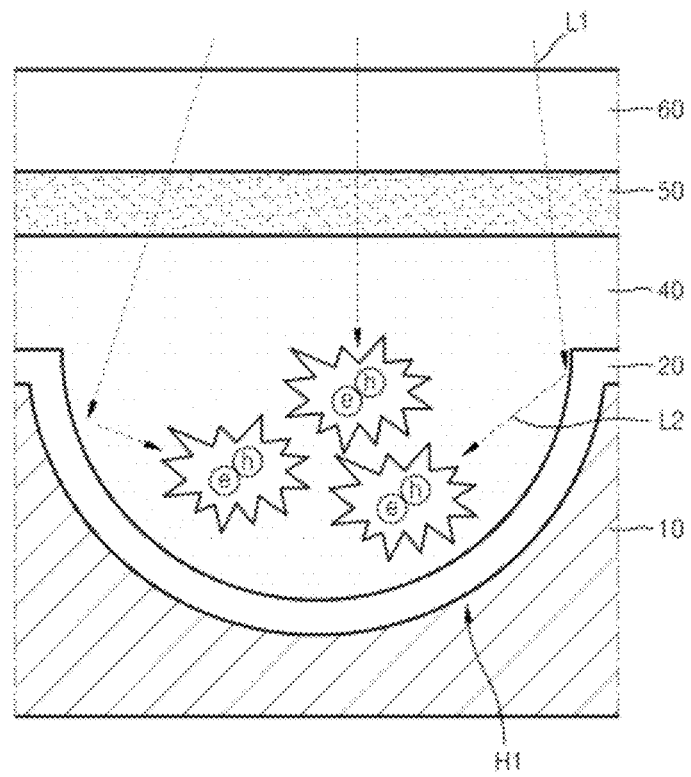
FIG. 2 is a schematic view illustrating an exciton generation mechanism in a photoactive layer of a solar cell according to an embodiment.

FIG. 2 is a schematic view illustrating an exciton generation mechanism in the photoactive layer 40 of the solar cell according to an embodiment. The solar cell of FIG. 2 has the structure illustrated in FIG. 1. However, for convenience of description, the nanostructures 30 are not illustrated in FIG. 2.

Referring to FIG. 2, when light L1 is incident on the photoactive layer 40, excitons, that is, electron-hole (e-h) pairs may be generated in the photoactive layer 40 accordingly. Also, as the incident light L1 is reflected by the first electrode 20 to generate reflection light L2, excitons (electron-hole pairs) are generated again in the photoactive layer 40. As the concave portions H1 are formed in the base layer 10, and the first electrode 20 is conformally formed according to the shape of the concave portions H1, the incident light L1 may be easily internally reflected into an inner portion of the concave portions H1, that is, into the photoactive layer 40. As described above, as "internal reflection" of the incident light L1 is easily induced by the concave portions H1, a path along which the reflection light L2 passes through the photoactive layer 40 may be elongated. That is, the reflection light L2 may stay inside the photoactive layer 40 for a longer time. Consequently, photon absorption of the photoactive layer 40 may increase, and the number of excitons generated in the photoactive layer 40 may increase. In addition, an effective surface area of the first electrode 20 increases due to the concave portions H1, and thus, an amount of generated electricity per unit installation area may increase.

For the reasons described above, when the base layer 10 including the concave portions H1 and the first electrode 20 are used, the photovoltaic conversion efficiency of the solar cell may be improved compared to when a flat base layer and a flat first electrode are used.

Figure 3:
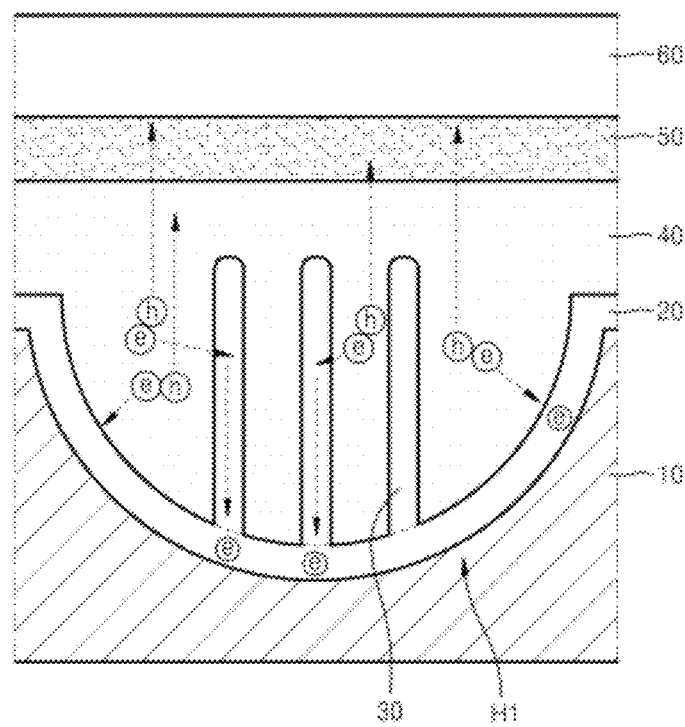
FIG. 3 is a schematic view illustrating a carrier moving mechanism in a solar cell according to an embodiment.

FIG. 3 is a schematic view illustrating a carrier moving mechanism in a solar cell according to an embodiment. The solar cell illustrated in FIG. 3 has the structure of FIG. 1.

Referring to FIG. 3, excitons, that is, electron-hole pairs, generated in the manner described with reference to FIG. 2 are separated (dissociated) in the photoactive layer 40 into electrons (e) and holes (h); the electrons (e) may move toward the first electrode 20, and the holes (h) may move toward the second electrode 60. When a plurality of nanostructures 30 are formed as in the current embodiment, the electrons (e) may easily move due to the nanostructures 30. In detail, as the plurality of nanostructures 30 may be formed of an inorganic material having a higher electron mobility than that of the photoactive layer 40, they may function as a pathway through which electrons can move at high speed. In addition, the plurality of nanostructures 30 extend into the inner portion of the photoactive layer 40 to contact more of the photoactive layer 40. Thus, the electrons (e) and the holes (h) which are separated from each other in the photoactive layer 40 are highly likely to move to the first electrode 20 and the second electrode 60, respectively, rather than recombining in the photoactive layer 40. In other words, since the plurality of nanostructures 30 are inserted into the photoactive layer 40, an effective surface area for carrier transportation may be greatly increased. Furthermore, due to the concave shape of the first electrode 20, a contact surface area between the first electrode 20 and the photoactive layer 40 is increased. Accordingly, the amount of carriers (electrons) collected at the first electrode 20 may increase also due to the concave first electrode 20.

As described above, when the first electrode 20 and the plurality of nanostructures 30 are formed in the base layer 10 having the concave portions H1, the amount of carriers collected to the first and second electrodes 20 and 60 is increased, and as a result, the photovoltaic conversion efficiency of the solar cell may be considerably increased.

Also, the solar cell according to the current embodiment may be a solar cell based on an organic material that basically includes the photoactive layer 40 formed of an organic material, and thus, may be flexible. The base layer 10 may be formed of a conductive material such as a metal and may have a relatively small thickness, and thus may be flexible. Although the nanostructures 30 are formed of an inorganic material, they extend into the inner side of the photoactive layer 40 and are attached to the first electrode 20. Accordingly, even when the solar cell is bent to some extent, the nanostructures 30 may maintain their shape and location. Accordingly, the solar cell according to the current embodiment may be flexible. The solar cell may be attached to another flexible substrate, if necessary.

As described above, in the solar cell according to the current embodiment, the nanostructures 30 may be formed of an inorganic material, and the photoactive layer 40 may be formed of an organic material. Accordingly, the solar cell according to the current embodiment be a hybrid type solar cell in which an inorganic material and an organic material are compounded. Carrier transport characteristics and photovoltaic conversion efficiency may be greatly improved by using the plurality of nanostructures 30 formed of an inorganic material, and various good aspects of the organic solar cell may be maintained by using the photoactive layer 40 formed of an organic material.

Hereinafter, a method of manufacturing the solar cell according to the current embodiment will be described.

FIGS. 4A through 4G are cross-sectional views illustrating a method of manufacturing a solar cell according to an embodiment.

Figure 4A:
FIGS. 4A through 4G are cross-sectional views illustrating a method of manufacturing a solar cell according to an embodiment.

Referring to FIG. 4A, a predetermined base layer 100, a type of substrate, may be provided. The base layer 100 may be a conductive layer. For example, the base layer 100 may be a conductive layer including Al. In detail, the base layer 100 may be an Al layer. When the base layer 100 is an Al layer, the Al layer may be a mirror-finished Al layer. However, the material of the base layer 100 is not limited to Al.

Figure 4B:
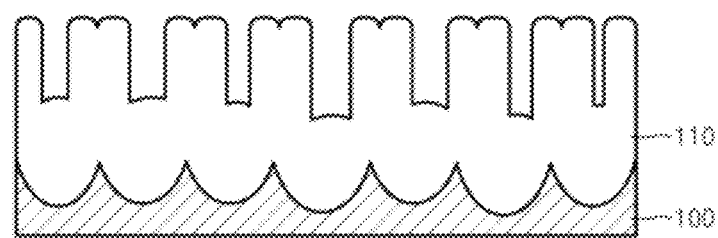

Referring to FIG. 4B, one surface, for example, an upper surface, of the base layer 100 may be anodized to form an oxide layer 110 on the surface. When the base layer 100 is an Al layer, the oxide layer 110 may be an Al oxide layer. During the anodizing operation, the rest of the surface of the base layer 100 except an oxidization target surface may be prevented from being oxidized by masking. The anodizing may be mild anodization. The mild anodization refers to an anodizing operation that proceeds relatively slowly, and the oxide layer 110 formed using the mild anodization may be a porous layer. Also, the oxide layer 110 that is formed by using the anodizing operation may have a bottom surface having convex patterns as illustrated in FIG. 4B.

Figure 4C:
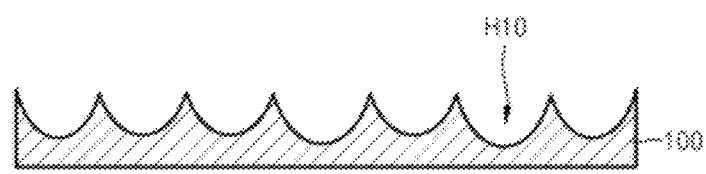
Figure 5:
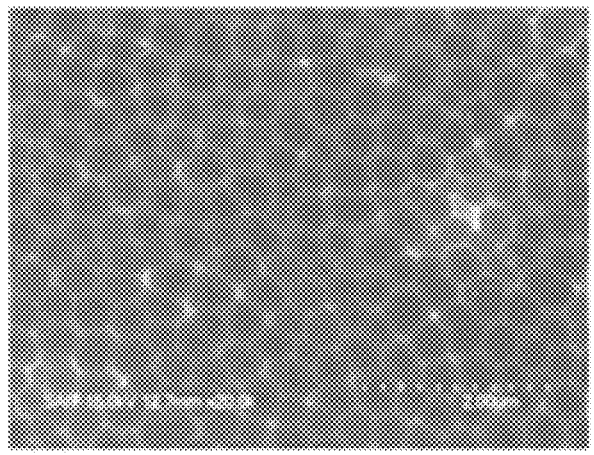
FIG. 5 is a photographic image of a base layer (Al layer) formed using the method illustrated in FIGS. 4A through 4C, captured using a scanning electron microscope (SEM), according to an embodiment.

As illustrated in FIG. 4C, a plurality of concave portions H10 may be formed by removing the oxide layer 110. The plurality of concave portions H10 may be, for example, hemisphere type or semi-hemisphere type concave portions. The size and shape of the plurality of concave portions H10 may be somewhat irregular. FIG. 5 is a planar photographic image of a base layer (Al layer) formed using the method illustrated in FIGS. 4A through 4C, captured using a scanning electron microscope (SEM), according to an embodiment. Referring to FIG. 5, a plurality of round concave portions are formed in a surface of the base layer (Al layer).

Figure 4D:
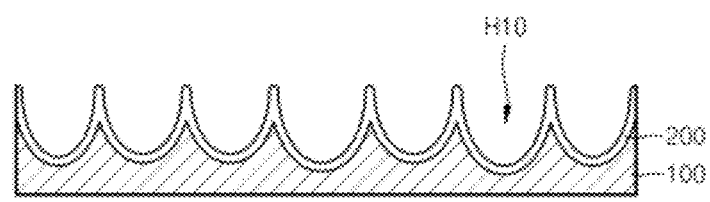

Referring to FIG. 4D, a first electrode 200 may be formed on an upper surface of the base layer 100 in which the plurality of concave portions H10 are formed. The first electrode 200 may be conformally formed according to the shape of the surface (upper surface) of the base layer 100. Thus, the shape of the plurality of concave portions H10 may be maintained almost the same. The first electrode 200 may be formed of at least one of, for example, Al, Ag, Au, and graphene, or of other materials. If the base layer 100 is a conductive layer and has a low specific resistance, the base layer 100 may be used as an electrode (bottom electrode), and thus the first electrode 200 may not be additionally formed. However, when the first electrode 200 having a higher electrical conductivity than the base layer 100 is formed, conductive characteristics of the solar cell may be improved.

Figure 4E:
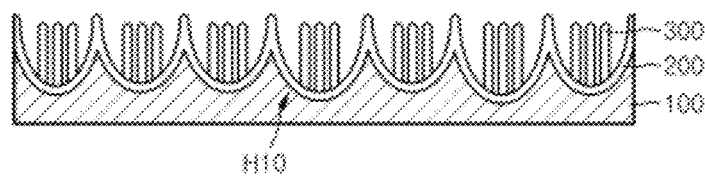

Referring to FIG. 4E, a plurality of vertical nanostructures (hereinafter, nanostructures) 300 may be formed on the first electrode 200. The plurality of nanostructures 300 may be, for example, in the form of nanorods or nanowires. The plurality of nanostructures 300 may be formed in each of the concave portions H10. The nanostructures 300 may be formed of an inorganic material. In this case, the nanostructures 300 may be formed of ZnO or any other inorganic material such as Si, CNT, $TiO_2$ or the like. When the nanostructures 300 are formed of an inorganic material, the nanostructures 300 may have excellent electron-transporting characteristics. The nanostructures 300 may be formed using a hydrothermal method or a chemical vapor deposition (CVD) method. When the nanostructures 300 are formed by using the hydrothermal method, a predetermined seed layer (not shown) may be formed on the first electrode 200, and the base layer 100 including the seed layer may be dipped in a precursor solution, and the precursor solution may be heated so as to grow the plurality of nanostructures 300 from the seed layer. The precursor solution may include a precursor of a material to be grown (e.g., ZnO). The forming of the seed layer may be optional in the hydrothermal method. That is, a plurality of nanostructures 300 may be directly grown from the first electrode 200 without forming a seed layer. When forming the nanostructures 300 using the CVD method, a predetermined seed layer (not shown) may be formed on the first electrode 200, and a reaction gas including a precursor of a material to be grown may be supplied into a deposition chamber to grow the plurality of nanostructures 300. The forming of the seed layer may also be optional in the CVD method. When using the CVD method, a catalyst layer (not shown) may be used according to necessity. The forming of the nanostructures 300 is not limited to the above-described methods and the nanostructures 300 may be formed using various other methods. A length (height) of the nanostructures 300 may be adjusted by controlling process conditions such as a reaction time, a process temperature, a flow rate of reaction gas, etc. Thus, the nanostructures 300 may have a length (height) corresponding to a depth of the concave portions H10. However, the length (height) of the nanostructures 300 is not limited thereto and may vary. For example, the nanostructures 300 may be longer (higher) than the concave portions H10 or shorter (lower) than the concave portions H10.

Figure 4F:
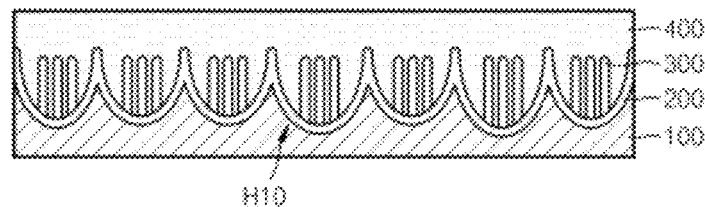

Referring to FIG. 4F, a photoactive layer 400 may be formed on the first electrode 200 to cover the plurality of nanostructures 300. The photoactive layer 400 may fill spaces between the plurality of nanostructures 300 and contact the entire surfaces of the plurality of nanostructures 300 and the first electrode 200. The photoactive layer 400 may include an organic material. For example, the photoactive layer 400 may be formed of an organic material layer (e.g., polymer layer) having a bulk heterojunction (BHJ) structure. In detail, the photoactive layer 400 may include P3HT:PCBM. However, the photoactive layer 400 is not limited thereto and may be formed of various other materials. Also, instead of the BHJ structure, the photoactive layer 400 may have other structures, for example, a PN bi-layer structure or a single layer structure.

Figure 4G:
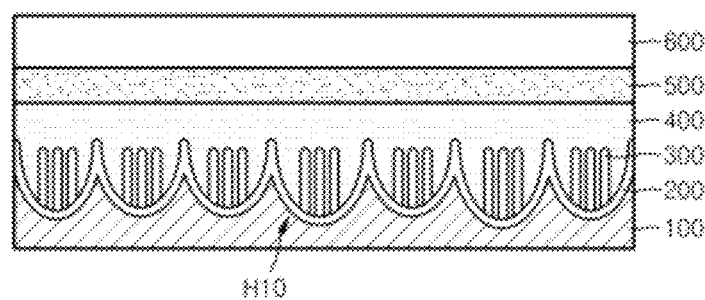

Referring to FIG. 4G, a hole transport layer 500 may be formed on the photoactive layer 400. For example, the hole transport layer 500 may be formed of a polymer such as TPD:DPS-TPD, TFB, PEDOT:PSS or the like. However, the material of the hole transport layer 500 is not limited thereto and may vary. Alternatively, the hole transport layer 500 may not be included according to circumstances. Next, a second electrode 600 may be formed on the hole transport layer 500. The second electrode 600 may be formed of, for example, a transparent conductive oxide such as ITO, IZO, or GIZO, or any other conductive material such as graphene. However, the materials of the second electrode 600 are exemplary, and the second electrode 600 may be formed of various other conductive materials.

The above-described method of manufacturing the solar cell may be modified in various ways. For example, a second anodizing operation may be performed to the base layer 100 of FIG. 4C. That is, n additional anodizing operation may be performed to the upper surface of the base layer 100, that is, the surface in which the plurality of concave portions H10 are formed, to form a second oxide layer. Then the second oxide layer may be removed. In this manner, a plurality of second concave portions may be formed in the base layer 100. As described above, the plurality of second concave portions formed by the second anodizing operation may have a more uniform size and shape than the concave portions H10 of FIG. 4C which are formed using one anodizing operation. Alternatively, the anodizing operation and the removing operation of the oxide may be performed three or more times. Also, alternatively, the plurality of concave portions H10 may be formed using an operation other than the anodizing operation. For example, a plurality of nanoparticles may be disposed on a substrate (base layer) and the substrate may be etched using the plurality of nanoparticles as etching barriers to form a substrate having a plurality of concave portions. Various other methods may also be used to form the plurality of concave portions H10.

As described above with reference to FIGS. 4A through 4G, when a solar cell is manufactured by forming the plurality of concave portions H10 in the base layer 100 by the anodizing operation and the subsequent depositing and growing operations of the layers of the solar cell, the solar cell with a large surface area may be manufactured at low costs. The anodizing operation is much more cost-effective and simpler than a lithography process, and is useful for a large surface process. Accordingly, according to the embodiments, large-surface, high efficiency solar cells may be easily manufactured at low costs.

While the inventive concept has been particularly shown and described with reference to the exemplary embodiments thereof, the exemplary embodiments should be considered in a descriptive sense only and not for purposes of limitation. For example, it will be understood by those of ordinary skill in the art that various changes in form and details of the structure of the solar cells of FIGS. 1 through 3 of the embodiments may be made. In detail, for example, at least one other material layer may be further formed between the layers 10 through 60 of the solar cells of FIGS. 1 through 3. In addition, the method of manufacturing the solar cell described with reference to FIGS. 4A through 4G may also be modified in various ways. Also, the above described embodiments are related to organic solar cells; however, the embodiments may also be applied to other types of solar cells. Therefore, the scope of the inventive concept is defined not by the detailed description but by the appended claims.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A solar cell comprising:
    a substrate having a surface in which a plurality of concave portions are formed, the substrate comprising a first electrode that is formed on the surface in which the plurality of the concave portions are formed and has concave shapes corresponding to the plurality of the concave portions;
    a plurality of vertical nanostructures that are disposed directly on a surface of the first electrode in each of the plurality of concave portions;
    a photoactive layer that is disposed in the concave portions and completely covers the plurality of nanostructures; and
    a second electrode that is disposed on the photoactive layer.

2. The solar cells of claim 1, wherein the plurality of nanostructures are in a form of nanorods.

3. The solar cell of claim 1, wherein the plurality of nanostructures comprise an inorganic material.

4. The solar cell of claim 1, wherein the plurality of nanostructures comprise at least one of ZnO, Si, CNT, and $TiO_2$.

5. The solar cell of claim 1, wherein the photoactive layer comprises an organic material.

6. The solar cell of claim 5, wherein the photoactive layer comprises a bulk heterojunction structure.

7. The solar cell of claim 1, further comprising a hole transport layer disposed between the photoactive layer and the second electrode.

8. The solar cell of claim 1, wherein the concave portions have a hemisphere shape or a semi-hemisphere shape.

9. The solar cell of claim 1, wherein the substrate comprises aluminum (Al).

10. The solar cell of claim 1, wherein the substrate comprises:
    a base layer having a surface in which the plurality of concave portions are formed; and
    the first electrode being formed conformally on the surface of the base layer.

11. The solar cell of claim 1, wherein the plurality of concave portions are formed such that light incident on the photoactive layer are reflected at concave surfaces of the surface of the substrate toward an inner portion of the concave portions, and
    wherein when the light is incident on the photoactive layer, excitons are generated in the photoactive layer, and when the light is reflected at the concave surfaces of the substrate toward the inner portion of the concave portions, more excitons are generated.

12. The solar cell of claim 11, wherein the excitons comprise holes and electrons, and
    wherein a plurality of the nanostructures are disposed in each of the plurality of concave portions to be used as pathways of the electrons to move toward the first electrode.

13. The solar cell of claim 12, wherein the plurality of nanostructures comprise an inorganic material, and the photoactive layer comprises an organic material.

14. A solar cell comprising:
a first electrode having a surface in which a concave portion is formed;
a plurality of nanostructures formed directly on the surface of the first electrode in the concave portion;
a photoactive layer that fills the concave portion and completely covers the plurality of nanostructures; and
a second electrode formed on the photoactive layer.

15. A method of manufacturing a solar cell, the method comprising:
providing a substrate having a surface in which a plurality of concave portions are formed, wherein the substrate comprises a first electrode that is formed on the surface in which the plurality of the concave portions are formed and has concave shapes corresponding to the plurality of the concave portions;
forming a plurality of vertical nanostructures directly on a surface of the first electrode in each of the plurality of concave portions;
forming a photoactive layer in the concave portions and completely covering the plurality of nanostructures; and
forming a second electrode on the photoactive layer.

16. The method of claim 15, wherein the providing the substrate comprises:
forming an oxide layer by anodizing the surface of the substrate; and
forming the plurality of concave portions by removing the oxide layer from the substrate.

17. The method of claim 15, wherein the substrate is an aluminum substrate.

18. The method of claim 15, wherein the plurality of nanostructures comprises an inorganic material.

19. The method of claim 15, wherein the plurality of nanostructures comprise at least one of ZnO, Si, CNT, and $TiO_2$.

20. The method of claim 15, wherein the plurality of nanostructures are formed using a hydrothermal method or a chemical vapor deposition method.

21. The method of claim 15, wherein the photoactive layer comprises an organic material.

22. The method of claim 21, wherein the photoactive layer comprises a bulk heterojunction structure.

23. The method of claim 15, further comprising forming a hole transport layer between the photoactive layer and the second electrode.

24. The method of claim 15, further comprising forming a hole transport layer between the photoactive layer and the second electrode.

25. The solar cell of claim 1, wherein the plurality of vertical nanostructures are spaced apart from the second electrode.

26. The solar cell of claim 14, wherein at least a portion of the plurality of nanostructures is inside the concave portion.

27. The method of claim 15, wherein at least a portion of the plurality of vertical nanostructures is formed inside the concave portion.

* * * * *